United States Patent [19]

Takubo et al.

[11] Patent Number: 4,991,001
[45] Date of Patent: Feb. 5, 1991

[54] IC PACKING DEVICE WITH IMPEDANCE ADJUSTING INSULATIVE LAYER

[75] Inventors: Chiaki Takubo, Yokohama; Kazutaka Saito; Toshio Sudo, both of Kawasaki, all of Japan

[73] Assignee: Kabushiki Kaisha Toshiba, Kawasaki, Japan

[21] Appl. No.: 331,286

[22] Filed: Mar. 31, 1989

[30] Foreign Application Priority Data

Mar. 31, 1988 [JP] Japan ................... 63-79695

[51] Int. Cl.⁵ ................. H01P 5/08; H01L 23/50; H01L 21/60
[52] U.S. Cl. ....................... 357/80; 357/70
[58] Field of Search ............. 357/70, 80; 333/34, 333/246

[56] References Cited

U.S. PATENT DOCUMENTS

| | | | |
|---|---|---|---|
| 3,975,690 | 8/1976 | Fleming | 357/3 |
| 4,543,544 | 9/1985 | Ziegner | 333/34 |
| 4,551,747 | 11/1985 | Gilbert et al. | 357/87 |
| 4,626,889 | 12/1986 | Yamamoto et al. | 357/51 |
| 4,724,409 | 2/1988 | Lehman | 333/260 |
| 4,806,892 | 2/1989 | Thorpe et al. | 333/246 |
| 4,949,163 | 8/1990 | Sudo et al. | 357/80 |

FOREIGN PATENT DOCUMENTS

| | | |
|---|---|---|
| 176153 | 8/1987 | Japan . |
| 63-302531 | 12/1988 | Japan . |
| 64-14933 | 1/1989 | Japan . |
| 64-14934 | 1/1989 | Japan . |
| 1-84626 | 3/1989 | Japan ................... 357/74 |

OTHER PUBLICATIONS

Derwent Publications, EP-293,838, Dec. 1988.

*Primary Examiner*—Andrew J. James
*Assistant Examiner*—Viet Q. Nguyen
*Attorney, Agent, or Firm*—Oblon, Spivak, McClelland, Maier & Neustadt

[57] ABSTRACT

There is disclosed a mounting structure for a semiconductor integrated circuit device or IC device having signal transmission terminals, which has an insulative substrate on which the IC device is mounted, a conductive signal transmission wiring line formed on the substrate and electrically connected to a selected one of the signal transmission terminals of the IC device, and an insulative resin layer formed on the substrate to at least partially cover the signal transmission wiring line. The insulative resin layer functions to change and set the impedance of the signal transmission wiring line to a desired impedance value. The insulative resin layer is formed to have a selected thickness such that the characteristic impedance of the wiring line, which tends to fluctuate in the wiring line etching formation process, can be adjusted and set towards a destination characteristic impedance.

16 Claims, 14 Drawing Sheets

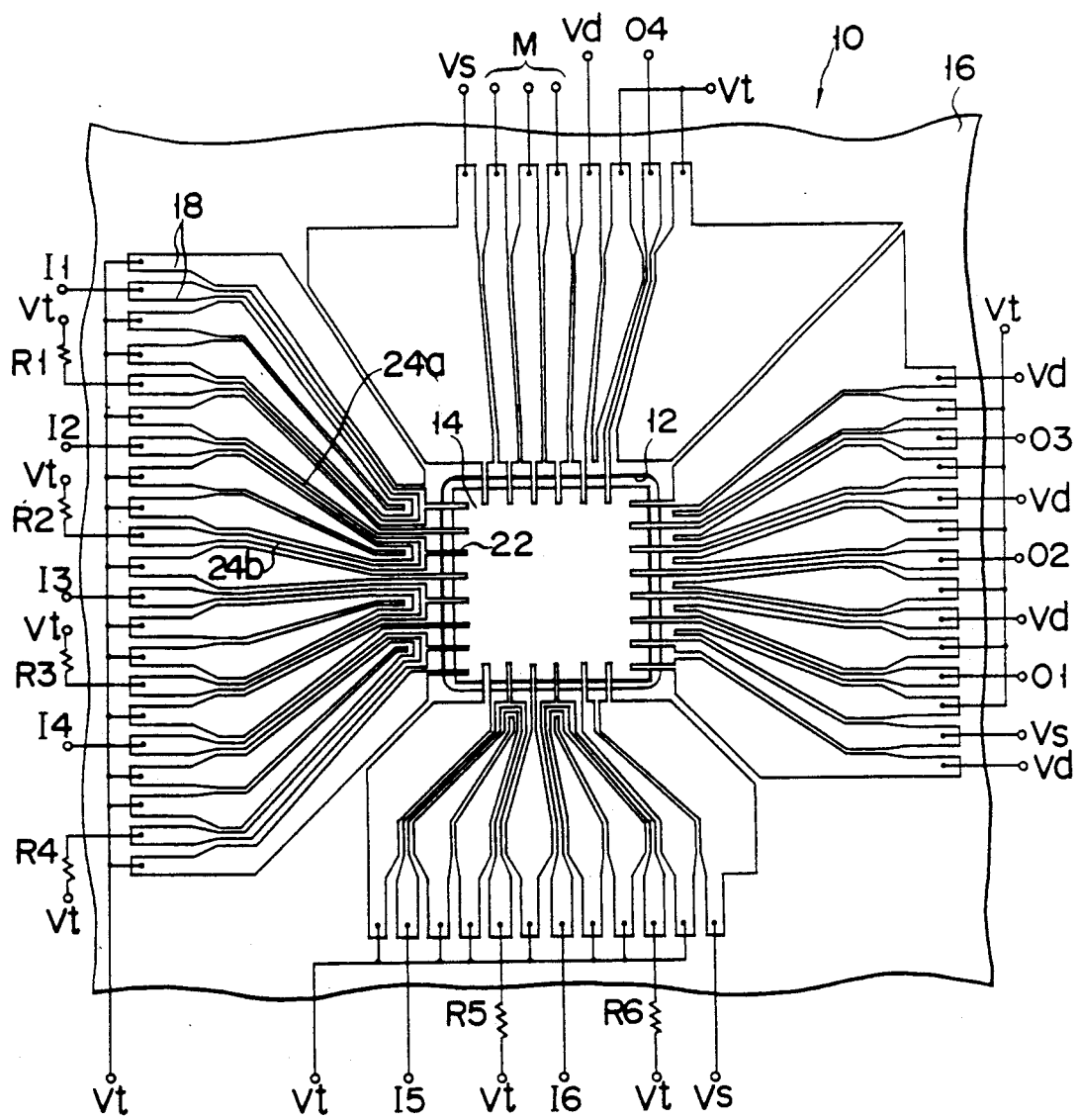
F I G. 1

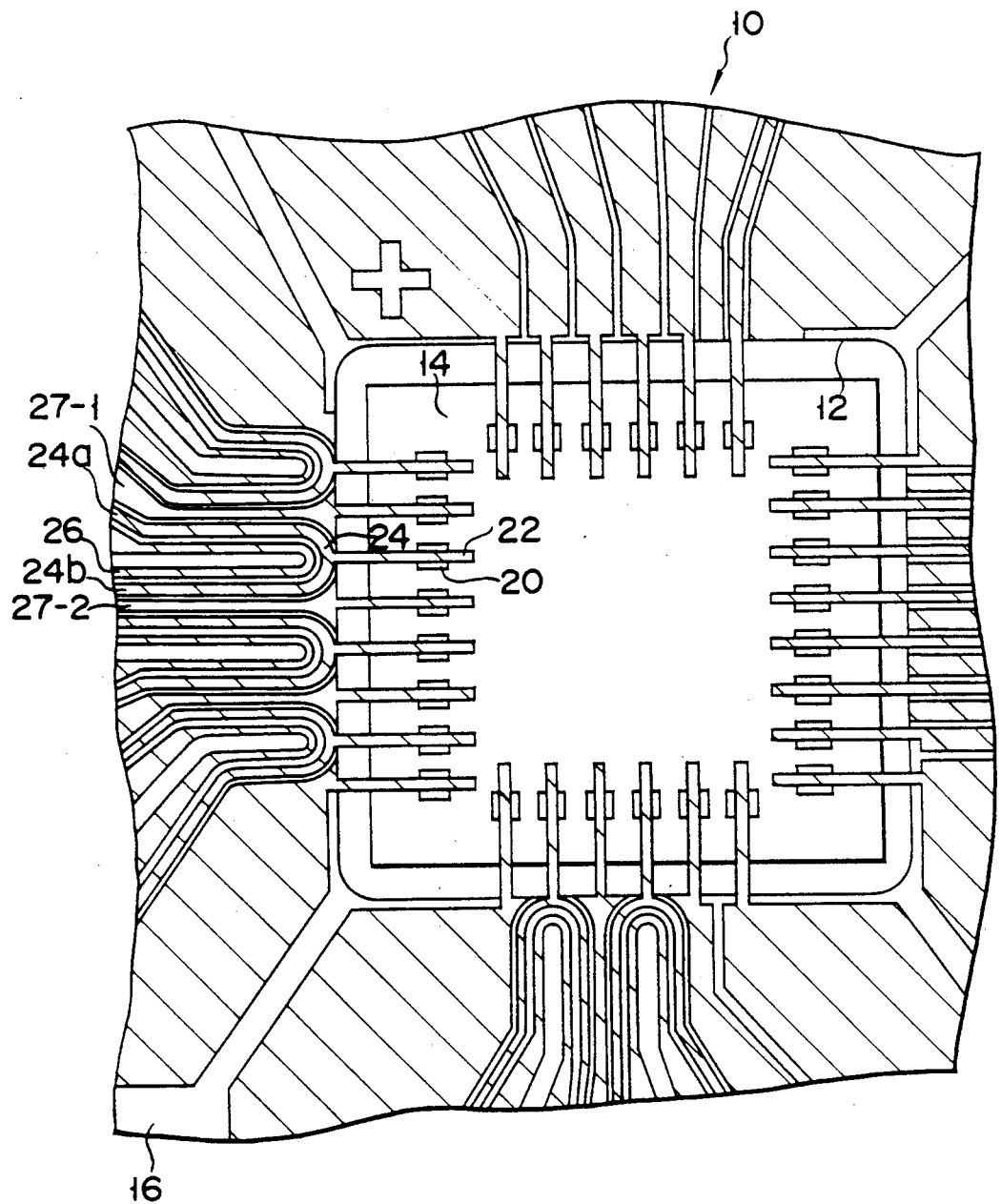
F I G. 3

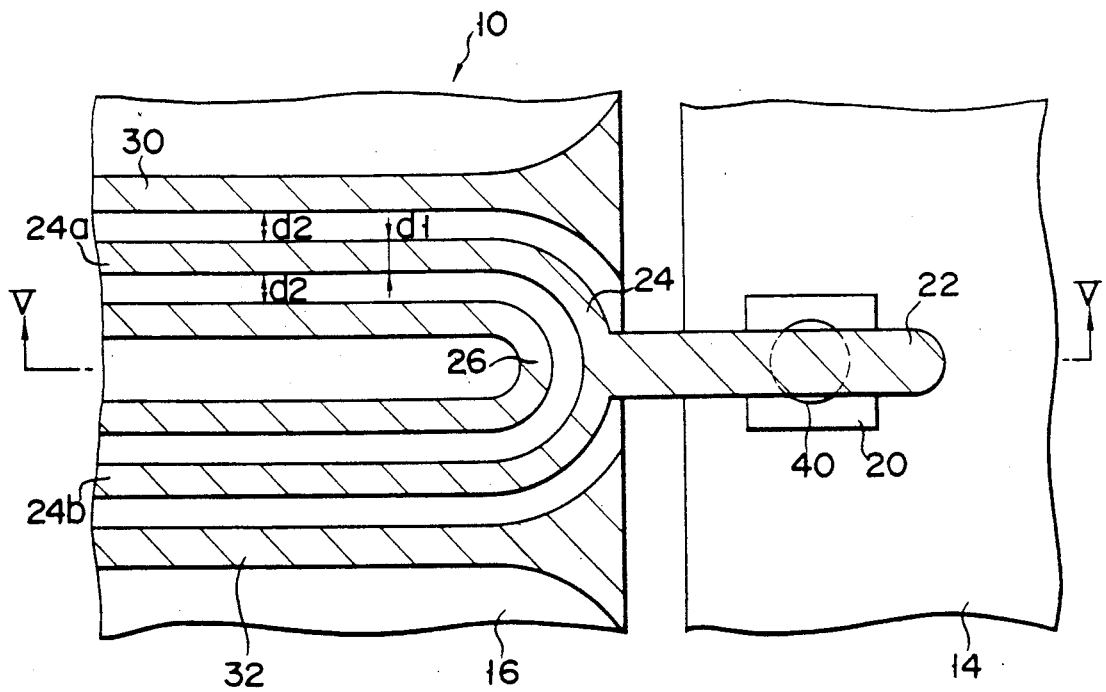
F I G. 4
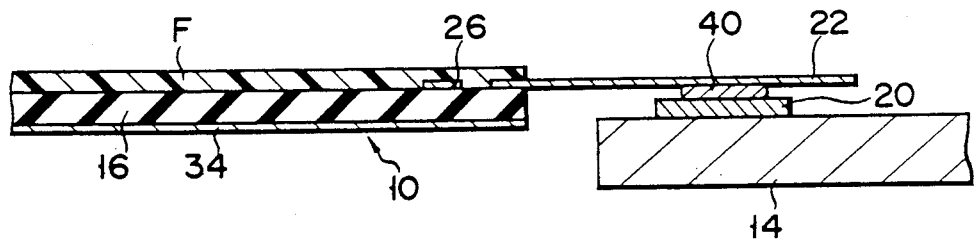
F I G. 5

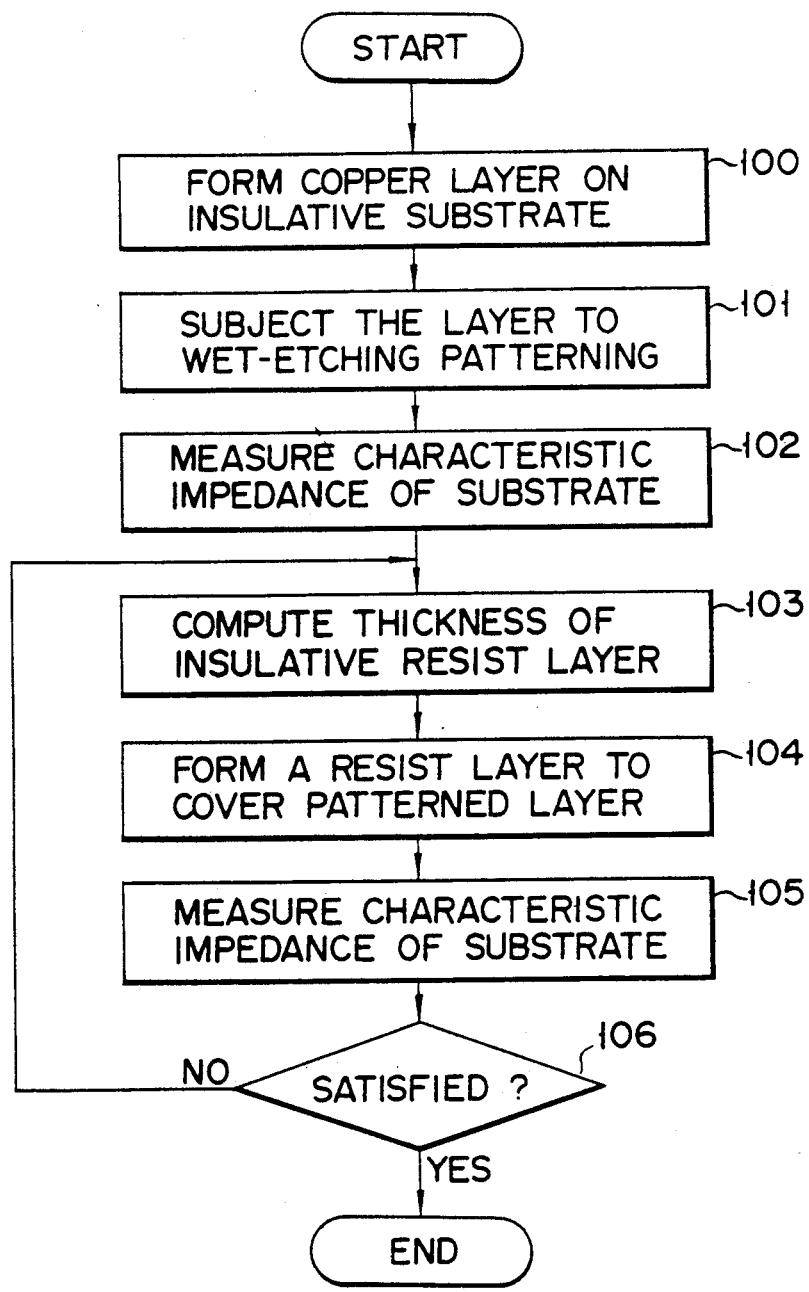
F I G. 9

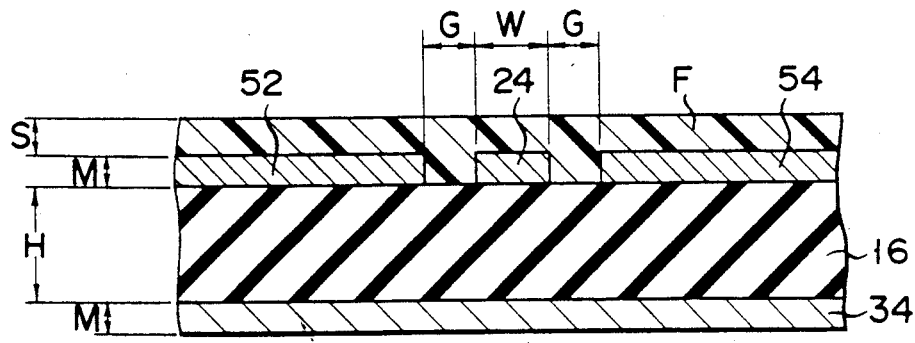
F I G. 12A
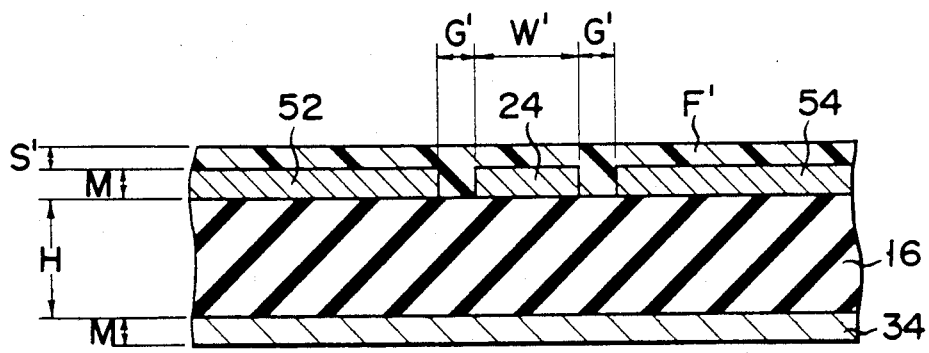
F I G. 12B

IC PACKING DEVICE WITH IMPEDANCE ADJUSTING INSULATIVE LAYER

Background of the Invention

1. Field of the Invention

This invention relates to a packaging technique of semiconductor integrated circuit devices, and more particularly to mounting devices for semiconductor integrated circuit chips capable of high speed logic performance.

2. Description of the Related Art

With the increasing needs for high speed logic performance of digital systems, a great deal of attention is paid to gallium arsenide (hereinafter referred to as "GaAs"). Recently, integrated circuit devices capable of high speed logic performance at a switching speed of about 100 picoseconds have been developed by integrating GaAs MOSFETs. However, the packaging technique of such high-speed devices is still under development.

If chips of high-speed devices are mounted on packages of conventional structures, high performance of the devices themselves cannot be fully obtained. This is because the efficiency of high-speed signal transmission is degraded in the wiring (normally, bonding wiring) between the device chips and the packages. Degradation in the signal transmission characteristic in the IC packages results not only from degradation in impedance-matching in connecting terminals but also from the fact that, in high-speed transmission of logic signals, bonding wires themselves adversely behave as an "open stub" which degrades uniformity of the signal processing characteristic of a device.

In order to solve the above technical problem, use of a tape-automated bonding substrate or TAB substrate has been proposed. An IC package using such a TAB substrate is disclosed in, for example, U.S. Pat. application No. 201,963 (filed on June 2, 1988) and corresponding EPC Patent Application No. 88108701.9 (filed on May 31, 1988). The TAB substrate disclosed in the above Patent Applications has a so-called "feed-through" wiring pattern which permits the "open-stub length" to be reduced, thus providing a chip mounting arrangement for minimizing degradation in the signal transmission characteristic in the package wiring of the high-speed semiconductor IC chip.

In general, an etching method is utilized to form the above wiring pattern of the TAB substrate. However, the presently available etching technique is still unsatisfactory in its processing precision. When the ground conductive layer is etched to form the "feedthrough" wiring pattern of the TAB substrate and if the wiring width is small, the resultant wiring pattern will vary in its wiring width. Such a variation in the wiring width degrades uniformity of the characteristic impedance of the TAB substrate, and as a result, the signal transmission characteristic of the TAB substrate is deteriorated. Judging from the level of the presently available etching technique, it will be extremely difficult to enhance the etching precision so as to solve the above problem. In particular, when it is required to realize, on the TAB substrate, a signal transmission wiring pattern which is large (for example, approx. 20 μm) in its film thickness and small (for example, wiring width of approx. 50 μm and pitch of 30 μm) in its wiring width and pitch by use of the wet etching method, formation of the wiring pattern with high precision and high manufacturing yield cannot be expected. As a result, the impedance matching between the IC chip mounted on the TAB substrate and the signal transmission wiring pattern of the TAB substrate will be deteriorated.

Summary of the Invention

It is therefore an object of the present invention to provide a new and improved chip mounting arrangement which is excellent in its signal transmission characteristic and suitable for high-speed semiconductor devices, and a method for manufacturing the same.

In accordance with the above objects, the present invention is addressed to a specific mounting structure for a semiconductor integrated circuit device or IC device, and the mounting structure comprises:

an insulative substrate on which the IC device is formed;

a conductive lead wiring line formed on the substrate and electrically connected to a selected one of the signal transmission terminals of the IC device; and impedance converting means for converting and setting the impedance of the lead wiring line to a desired impedance value, the converting means having an insulative film which is formed on the substrate to at least partially cover the lead wiring line, the material and/or thickness of which is selected to adjust the characteristic impedance of the lead wiring line (which tends to fluctuate in the etching process for formation of the lead wiring line) to a desired correct characteristic impedance, and which comprises a coated resin layer.

The invention is also addressed to a method for manufacturing the mounting structure for the IC device comprising the steps of:

performing an etching process to form a conductive lead wiring line which is electrically connected to a selected one of mounting transmission terminals of an IC device on an insulative substrate; and forming an insulative film to cover at least part of the lead wiring line on the substrate so as to compensate for variation in the impedance of the lead wiring line and adjust the impedance thereof to a desired impedance value.

The present invention and its objects and advantages will become more apparent from the detailed description of preferred embodiments presented below.

Brief Description of the Drawings

In the detailed description of a preferred embodiment of the invention presented below, reference is made to the accompanying drawing of which:

FIG. 1 is a diagram showing an entire plan view of a TAB substrate which is an IC packing device according to a preferred embodiment of this invention;

FIG. 3 is an enlarged diagram showing the central portion of the TAB substrate of FIG. 1 including a square opening in which the IC chip is mounted;

FIG. 4 is a further enlarged diagram of an electrically connecting portion between the TAB substrate of FIG. 1 and an IC chip mounted on the TAB substrate;

FIG. 5 is a diagram showing the cross section of the TAB substrate taken along line V–V of FIG. 4;

FIG. 9 is a flowchart showing a characteristic impedance adjusting process using insulative resin layer F of this invention;

FIGS. 12A and 12B are diagrams showing the main cross sections of a TAB substrate having insulative resin layer F whose thickness varies in the early stages and latter stages of a long-term etching period during which the TAB wiring patterns are subjected to an etching process;

Detailed Description of the Preferred Embodiments

Figure 2:
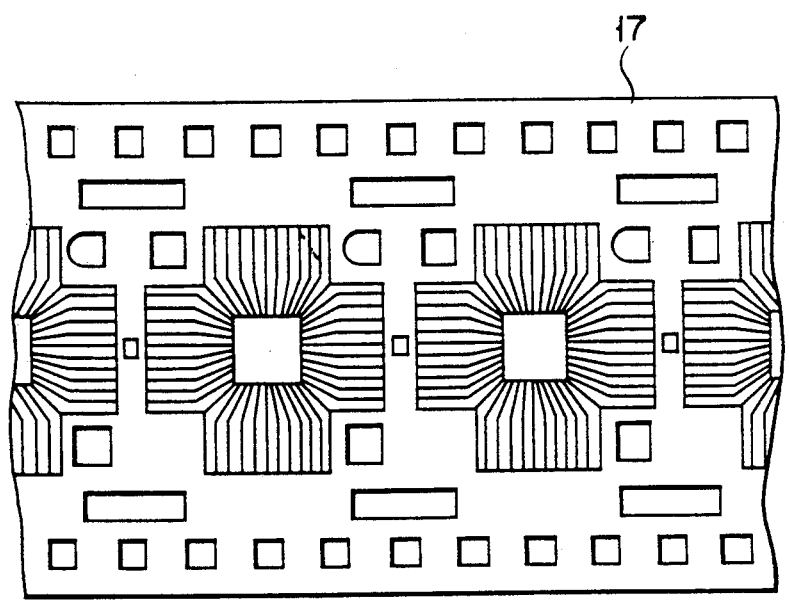
FIG. 2 is a diagram partially showing a plan view of a tape-shaped carrier film strip formed of a series of TAB substrates each having the same construction as that of FIG. 1.

FIG. 1 shows a chip mounting arrangement as an IC packing device (not drawn to scale) according to a preferred embodiment of this invention. The packing device utilizes a substrate (generally called a "TAB substrate" in this technical field) presented according to the "Tape-Automated Bonding" technique, which is generally designated by reference numeral "10". TAB substrate 10 has square opening 12 formed at substantially the central portion thereof. GaAs semiconductor IC chip 14 is arranged in square opening 12. In this example, IC chip 14 is a multiplexer unit formed by use of GaAs MESFETs and capable of performing a high-speed operation at a switching speed of approx. 100 picoseconds.

TAB substrate 10 includes resin film 16 of, for example, polyimide or glass epoxy, and a thin film wiring line pattern defined on film 16 by photoetching. Normally, TAB substrates 10 are formed in series on tape-shaped carrier film strip 17 as shown in FIG. 2 such that the same wiring line patterns are repeatedly arranged. TAB substrate 10 for one package is obtained by cutting off the strip of FIG. 2.

As is illustrated in FIG. 1, the wiring line pattern of TAB substrate 10 is constituted by copper (Cu) thin film lead wiring lines which radially extend from square opening 12 on resin film 16. The ends of signal wiring lines connected to the connecting terminal pads of IC chip 14 are formed as "tongues" to project from the edges of opening 12 towards the center thereof. An enlarged view of the wiring line pattern arranged around opening 12 of TAB substrate 10 is shown in FIG. 3 in more detail for an easy understanding.

Connecting terminal pads 18 arranged on the outer peripheral portion of TAB substrate 10 are used to connected substrate 10 mounted on IC chip 14 to corresponding terminal pads of an external printed wiring board (not shown). Terminal pads 18 include signal input terminals 11 to 16, signal output terminals 01 to 04, terminals connected to first power source voltage terminal Vd, terminals connected to second power source voltage terminal Vs, signal monitoring terminal M and "feed-through" terminals. The "feedthrough" terminals are connected to terminal voltage Vt via impedance-matching resistors or terminal resistors R1 to R6.

As shown in FIG. 1, the signal output terminals of IC chip 14 mounted on TAB substrate 10 are respectively connected to output terminals 01 to 04. Two terminal voltage Vt supplying lines are formed to respectively extend along both sides of each signal output line on resin film 16. The power source terminals of IC chip 14 are connected to corresponding power source terminals Vd and Vs of TAB substrate 10.

Now, the arrangement of TAB wiring lines connected to six signal input terminals 11 to 16 of IC chip 14 will be explained. In this embodiment, the TAB wiring line pattern is designed such that terminal resistor R can be externally connected to each input terminal by use of "feedthrough" technique. First, one of input terminal pads 20 (FIG. 3) of IC chip 14 is explained. The "feedthrough" connection structures for other input terminals can be obtained in the same manner.

In FIG. 3, the TAB wiring line tongue (which is hereinafter referred to as an "interconnection lead" or "inner lead" in the following description) connected to signal input pad 20 of multiplexer IC chip 14 is designated by reference numeral "22". TAB inner lead 22 has half loop pattern 24 on TAB substrate film 16. Half loop pattern 24 is connected to one end to one of TAB terminal pads 18 which is also connected to terminal I2; whereas, the other end thereof is connected to another TAB terminal pad 18 which is in turn connected to terminal resistor R2 as shown in FIG. 1. In other words, TAB inner lead 22 is branched into two wiring lines 24a and 24b. Wiring line 24a substantially radially extends on resin film 16 so as to be connected to terminal I2, whereas wiring line 24b substantially radially extends so as to be connected to terminal voltage Vt via resistor R2. Thus, the "feedthrough" structure can be obtained.

Another half loop pattern 26 is formed inside half loop pattern 24 on resin film 16. The configuration of the patterns is shown in FIG. 1, but it will be more easily understood by referring to FIG. 3. Half loop pattern 26 is formed to extend along branch wiring lines 24a and 24b of TAB inner lead 22 so that both ends thereof can be connected to terminal voltage Vt.

According to this embodiment, the TAB wiring pattern utilizes a combined form of a "microstrip transmission line structure" and a "grounded coplanar transmission line structure" (which can also be referred to as "coplanar microstrip transmission line structure") in branch wiring lines 24a and 24b. More specifically, as shown in a further enlarged view of FIG. 4, the widths of branch wiring lines 24a and 24b of each inner lead 22 are substantially constant (d1). Half loop pattern 26 of ground line arranged inside branch half loop pattern 24 of inner lead 22 and wiring lines 30 and 32 arranged outside half loop pattern 24 are formed to define constant space distances d2 therebetween, thus forming the "coplanar transmission line structure".

Figure 6:
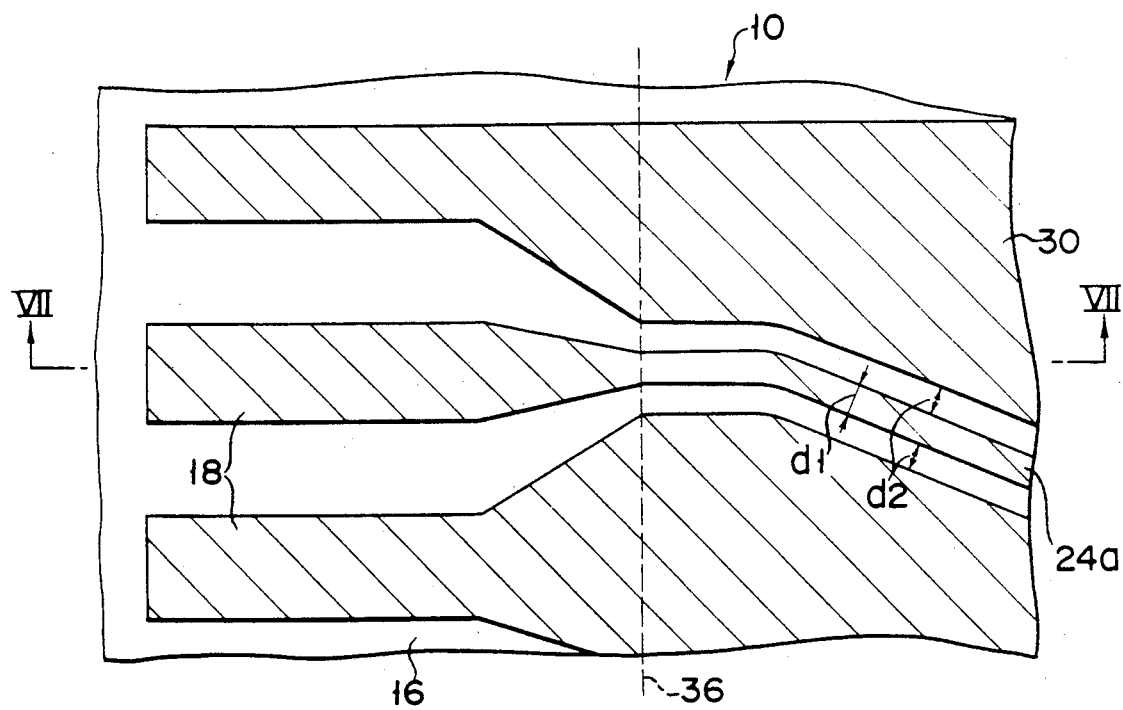
FIG. 6 is an enlarged diagram showing a plan view of the peripheral portion of external wiring terminal pads of the TAB shown in FIG. 1.
Figure 7:
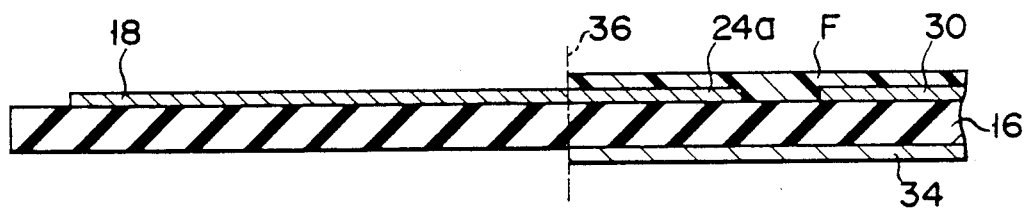
FIG. 7 is a diagram showing the cross section of the TAB substrate taken along line VII—VII in FIG. 6.

As shown in FIG. 7, ground conductive layer 34 is formed on the rear surface of TAB resin film 16, thus constituting the "microstrip transmission structure". As is clearly seen from FIGS. 6 and 7, rear conductive layer 34 is formed so as not to overlap TAB terminal pads 18 in a plane. Further, it will be easily understood from FIGS. 6 and 7 that rear conductive layer 34 is formed on the entire rear portion of resin film 16 except that portion which faces the formation area of TAB terminal pads 18, that is, an inner area of TAB substrate 10 indicated by broken lines "36" in FIG. 6. In substrate area 36, branch wiring lines 24a and 24b of each inner lead 22 (similarly, the TAB wiring lines connected to the output terminal of IC chip 14) are bent and run in a concentric manner with distance d2 between wiring lines 24a, 24b and ground wiring lines arranged on both sides thereof kept constant. In this way, the "grounded coplanar transmission line" having substantially the constant characteristic impedance can be formed.

As shown in FIGS. 4 and 5, each inner lead 22 is directly connected to corresponding pad 20 of multiplexer IC chip 14 by means of bump electrode 40. Bump electrode 40 may be formed by gold-plating an barrier alloy layer of, for example, Ti-Ni-Pd, Ti-W, Ti-Pt or Cr-Cu. In a case where inner leads 22 are formed of a thin copper film in the same manner as the TAB wiring pattern, the barrier alloy layer of bump electrode 40 is previously plated with Sn or Au. In order to bond each inner lead 22 to a corresponding one of bump electrodes 40, a contact bonding tool, such as a "bonding tool" or "bonder", having temperatures of 350 to 500° C. is pressed against a bonding portion with a pressure of 30 to 80 g/lead. As a result, eutectic bonding (for a combination of Au-Sn) or thermocompression bonding (for a combination of Au-Au) is effected so that IC chip 14 can be stably fixed and mounted on TAB substrate 10 with an appropriate mechanical strength.

Careful attention should be paid to the following fact. That is, the characteristic impedance of electrical connection portion between inner leads 22 of the above presented TAB substrate 10 and IC chip 14 can be adjusted by appropriately changing the insulation material and/or the thickness of insulative resin layer F deposited to cover the wiring line pattern on substrate 10. More specifically, after the signal transmission wiring line pattern is formed on TAB substrate 10, insulative resin layer F is formed by coating as shown in FIG. 5 to cover at least that wiring line pattern portion of the wiring line pattern which lies around square opening 12 and which includes the high-speed signal transmission wiring lines 24 branched from inner leads 22 connected to signal input terminal pads 20 of multiplexer IC chip 14. Of course, insulative resin layer F may be formed to cover the entire portion of the signal transmission wiring line pattern on TAB substrate 10. The configuration of the outer peripheral portion of TAB substrate 10 obtained at this time is shown in FIG. 7. It was confirmed by the experiments effected by the inventors that the characteristic impedance of the signal transmission line of TAB substrate 10 could be easily and effectively adjusted to a desired impedance value by appropriately selecting the material and/or thickness of insulative resin layer F. The "impedance adjusting" feature of TAB substrate 10 of this invention, which is the nucleus of the inventive concept of this invention and is important, will now be described in detail with reference to FIGS. 8A to 8C.

Figure 8A:
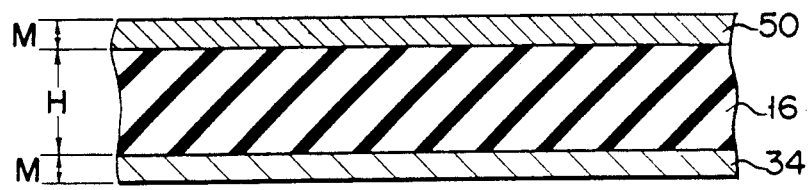
FIGS. 8A to 8C are diagrams showing the cross sections of main portions obtained in the main steps in the process of manufacturing the TAB substrate according to the above embodiment described with reference to FIGS. 1 to 7.

For simplifying the understanding of the basic concept of this invention, FIG. 8A typically shows only the sectional construction of part of TAB substrate 10 having the grounded coplanar transmission line. For example, resin film 16 of TAB substrate 10 is formed of a polyimide film with a dielectric constant of 3.2 and thickness H of 75 μm. In a case where the "feedthrough" wiring line pattern described before is formed on resin film 16 as the insulative substrate by using a currently available etching technique, ground conductive layer 50 is first deposited on the top surface of resin film 16 as shown in FIG. 8A. Conductive layer 50 may be a copper layer with thickness of M of 20 μm. conductive layer 34 formed on the opposite surface of resin film 16 functions as a ground layer as described before. Conductive layer 34 may also be a copper layer with thickness of M of 20 μm.

Figure 8B:
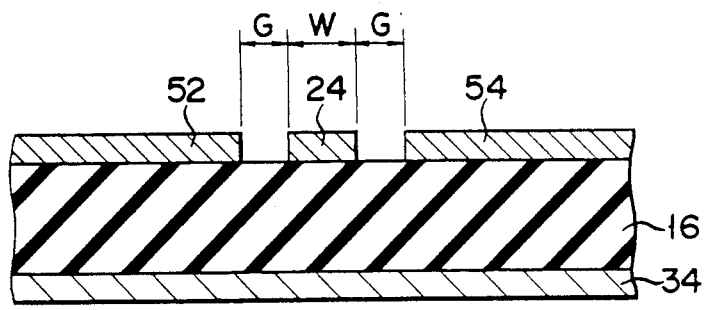

Subsequently, copper layer 50 is subjected to an etching process with a patterned photoresist film (not shown) used as a mask to form an etched layer structure which includes signal wiring line 24 and grounded wiring lines 52 and 54 (corresponding to signal wiring liens 26 and 32 of FIG. 4) disposed on both sides of the wiring line as shown in FIG. 8B. The etching process was effected by use of a wet etching method using a mixed solution of cupric chloride (100 g/litter) and hydrochloric acid (b 100 g/litter). After the unnecessary portion of copper layer 50 was etched out, the measurement of width W of signal wiring line 24 actually formed was 40 μm while the designed value of width W of the wiring line was 50 μm. The measurement of gap G between grounded layers 52 and 54 actually formed was 40 μm while the design value of the gap of the layers was 30 μm.

Figure 8C:
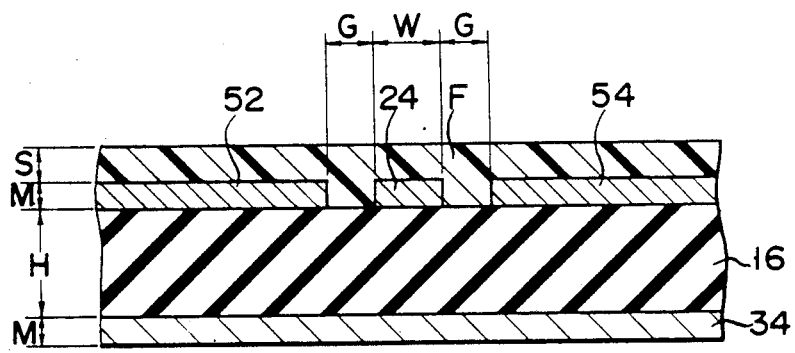

Next, as shown in FIG. 8C, insulative layer F is deposited on resin film 16 to cover signal wiring line 24 and grounded layers 52 and 54. Insulative layer F may be formed of an epoxy resin film with a dielectric constant of 4.5 to 4.7 which is generally known as a "solder resist" to those skilled in the art. Epoxy resist layer F may be formed by coating to a thickness of 30 μm using a well known screen printing technique.

Deposition of insulative layer F on the signal wiring pattern of TAB substrate 10 makes it possible to adjust the characteristic impedance of TAB substrate 10. That is, characteristic impedance Z of the transmission line of TAB substrate 10 may be changed to compensate for fluctuation in the etching process precision of the TAB wiring pattern by depositing insulative layer F to cover the wiring pattern, characteristic impedance Z of the transmission line of TAB substrate 10 may be changed to more precisely and effectively compensate for fluctuation in the etching process precision of the TAB wiring pattern by changing thickness S of insulative layer F. therefore, even if variation in the process precision of the high-speed signal transmission wiring pattern of TAB substrate 10 causes characteristic impedance Z of the resultant TAB substrate to be deviated from the initial designed value, the impedance matching between the wiring pattern of TAB substrate 10 and IC chip 14 to be mounted thereon can be easily improved by appropriate deposition of insulative resin layer F.

For example, consider the case wherein the initial design value of characteristic impedance Z of the signal transmission pattern of TAB substrate 10 was set to 50

Ω, and characteristic impedance Z of the signal transmission wiring pattern subjected tot he etching process and actually formed was set to 58 Ω. Even in this state, characteristic impedance Z could be adjusted to 50 Ω by coating epoxy resin layer F to thickness S of 30 μm using the screen printing technique. It should be noted that deposition of insulative resin layer F can be attained not only by the screen printing technique but also by other technique such as spin coating technique, and that the thickness of insulative layer F may be adjusted more precisely by setting the thickness of a film deposited in one coating step to a constant value and repeatedly effecting the coating steps than by setting the film to a final thickness by effecting a single coating process.

Next, the process of adjusting characteristic impedance Z of TAB substrate 10 by use of insulative resin layer F will be explained with reference to the flowchart shown in FIG. 9. First, copper thin films 34 and 50 are formed on the front and rear surfaces of insulative substrate 16 as described before to form a laminated structure shown in FIG. 8A (step 101). The thickness of the copper thin films is set as described before. The resultant structure is next subjected to a patterning process by wet etching, and as a result, the TAB substrate having the grounded coplanar transmission line structure including patterned signal wiring lines 24 as described with reference to FIG. 8B can be obtained (step 102).

At this time, characteristic impedance Z of the TAB substrate having the grounded coplanar transmission line structure is measured (step 102 in the flowchart of FIG. 9). If, in this case, measured characteristic impedance Z of the TAB substrate actually manufactured is deviated from initial designed value Z0 (this happens in most cases), it is necessary to calculate thickness S of insulative resin layer F so as to compensate for the difference between measured characteristic impedance Z and designed value Z0 (step 103). For example, assume that the designed value or destination value of characteristic impedance Z of the TAB substrate is 50 Ω, and the measured value of characteristic impedance Z of the TAB substrate actually formed. In this case, a calculation is effected to determine the thickness of the solder resist layer as insulative resin layer F formed on the TAB substrate in order to reduce characteristic impedance Z of the TAB substrate actually formed to 50 Ω. Since data indicating the relation between thickness S of the solder resist film and variation in characteristic impedance Z is stored in a table form in the memory of the calculation unit, the thickness of the solder resist film formed by coating on the patterned wiring lines can be efficiently calculated.

Then, solder resist layer F of calculated thickness S is formed on substrate 16 to cover signal wiring lines 24 (step 104). The configuration is shown in FIG. 8C. After the deposition of solder resist layer F, characteristic impedance of the TAB substrate is measured again (step 105), and it is checked if the measurement of characteristic impedance Z coincides with destination value Z0 (step 106). If a difference between the measurement and the destination value is within the tolerance (±10%), the compensation process for characteristic impedance Z of the resist film formed by coating is regarded as being completed, and the process of manufacturing TAB substrate 10 is completed. Alternatively, if a difference between the measurement and the destination value is outside the tolerance (±10%), the process is returned to step 103, and steps 103, 104, 105 and 106 are repeatedly effected according to the flowchart.

Figure 10:
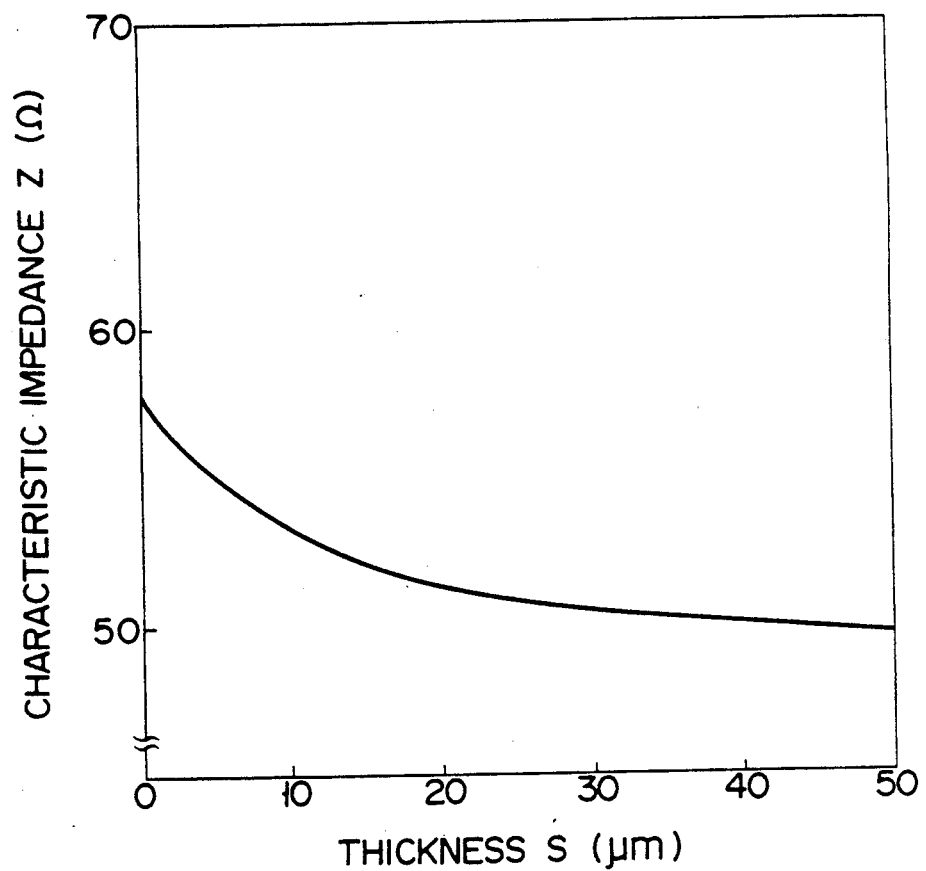
FIG. 10 is a graph showing the relation between thickness S of a solder resist film used as an insulative resin layer coated on the TAB substrate and characteristic impedance Z.

Measurement data indicating the relation between thickness S of the solder resist film or insulative resin layer F formed by coating on TAB substrate 10 and characteristic impedance Z is shown by a graph of FIG. 10. As clearly seen from the graph, if characteristic impedance Z of TAB substrate 10 before deposition of solder resist layer F was approx. 58 Ω, the characteristic impedance could be correctly adjusted to 50 Ω by coating solder resist layer F to a thickness of 50 μm. If other material having a dielectric constant smaller than that of the solder resist film is used as insulative resin layer F, it will be possible to more precisely adjust the characteristic impedance.

Figure 11:
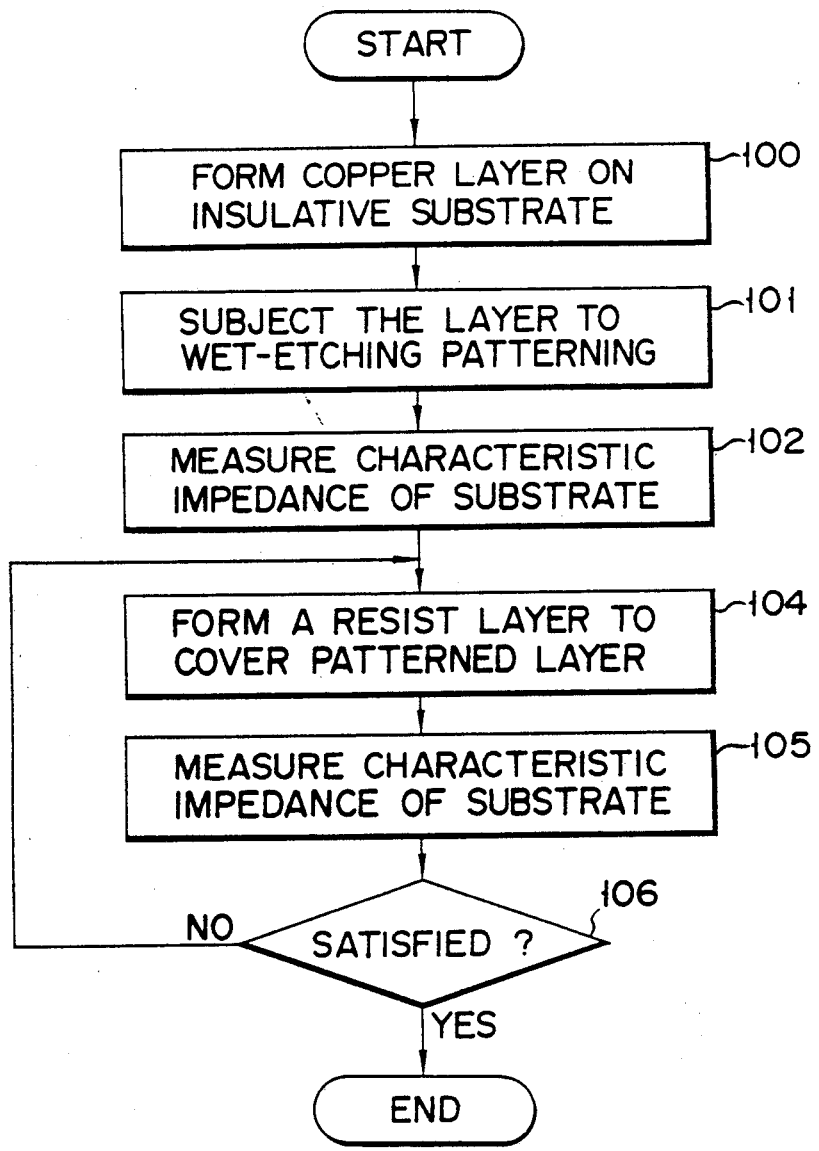
FIG. 11 is a flowchart showing another characteristic impedance adjusting process according to this invention.

The characteristic impedance adjusting process explained with reference to FIG. 9 may be modified as shown in FIG. 11. According to a method shown in FIG. 11, step 103 for calculating the thickness of insulative resin layer F to be coated on the patterned wiring lines of TAB substrate 10 is omitted. In this case, solder resist layer F with a constant thickness (for example, 10 μm) is repeatedly coated on TAB substrate 10. In other words, the final thickness of insulative resin layer F to be coated is not previously determined, and a plurality of thin insulative resin films each of which has a fixed thickness are lapcoated. The process of coating resin films F will be continued until it is determined that characteristic impedance Z of the resultant TAB substrate coincides with the destination value or is set within the tolerance range of the destination value.

According to this invention, even if the signal wiring pattern of TAB substrate 10 is formed by the currently available etching technique having a relatively low process precision, the characteristic impedance of the high-speed signal transmission line of TAB substrate 10 can be easily and effectively adjusted to a desired design value. This is because the adjusting process of the characteristic impedance can be attained simply by coating one or more insulative resin films F to cover the signal transmission line which has been subjected to a patterning process. This will bring great advantages into TAB substrate manufacturers. The "characteristic impedance adjusting" technique of this invention using insulative resin layer F is based on the fact detected by the inventors that the characteristic impedance of the TAB substrates manufactured can be variously changed by selectively setting the material (dielectric constant) and/or thickness of the insulative resin layer used. Such an insulative resin layer F may be formed to cover the entire portion of the signal wiring pattern of TAB substrate 10 or partly formed to cover only input terminals connected to the high-speed transmission terminals of IC chip 14 mounted on TAB substrate 10. Since data indicating the relation between thickness S of selected insulation resin layer F and variation in characteristic impedance Z can be previously stored, the deposition thickness of insulation resin layer F necessary for compensating for characteristic impedance Z of the patterned TAB wiring pattern can be easily and precisely calculated by using the relation indicating data. In this case, the characteristic impedance of TAB substrate 10 can be precisely adjusted to desired design value Z0 by coating a single insulation resin layer F of the calculated thickness. Alternatively, it is also possible to repeatedly coat thin insulation resin layer F on the wiring pattern of TAB substrate 10 without previously calculating the final film thickness until a desired design value of the characteristic impedance can be obtained. In this case, the film thickness calculation of insulative resin layer F can be omitted. As described above, the "characteristic impedance adjusting" technique of this invention using insulative resin layer F can be effected in various modes.

It should be noted that the etching process precision itself may vary because of deterioration in the quality of the etchant when used for a long-term etching process. As a result, the process precisions of the TAB wiring pattern in the early stages (at this time, the quality of the etchant is kept good) and the latter stages (at this time, the etchant quality is deteriorated) of the etching process period will be different from each other even in the same process condition. As shown in FIG. 12A, in the early stages of the etching process, normal line width W of wiring line 24 can be correctly defined. However, as the quality of the etchant is degraded, as shown in FIG. 12B, the line width of patterned wiring line 24 is set to increased width W' even if the process condition is kept unchanged. This results from deterioration of the etching ability due to the degradation of the quality of the etchant. Such variation in the etching processing precision with time can be predicted to some extent. Since the degradation degree of the process precision can be previously measured with respect to the etching processing period, the thickness of insulative resin layer F for compensation for the characteristic impedance can be selectively determined according to time at which the etching process is effected. In other words, deposition thickness S of insulative resin layer F in the early stages of the etching process can be set as the normal thickness (see FIG. 12A) and the thickness of insulative resin layer F can be selectively determined such that deposition thickness S (indicated by "S'" in FIG. 12B) of insulative resin layer F may be more reduced according as the etching process is more prolonged. In this case, the insulative resin layer whose thickness is set to a small value is designated by reference numeral "F'" in FIG. 12B.

Although the invention has been described with reference to a specific embodiment, it shall be understood by those skilled in the art that numerous modifications may be made that are within the spirit and scope of the inventive contribution.

Figure 13:
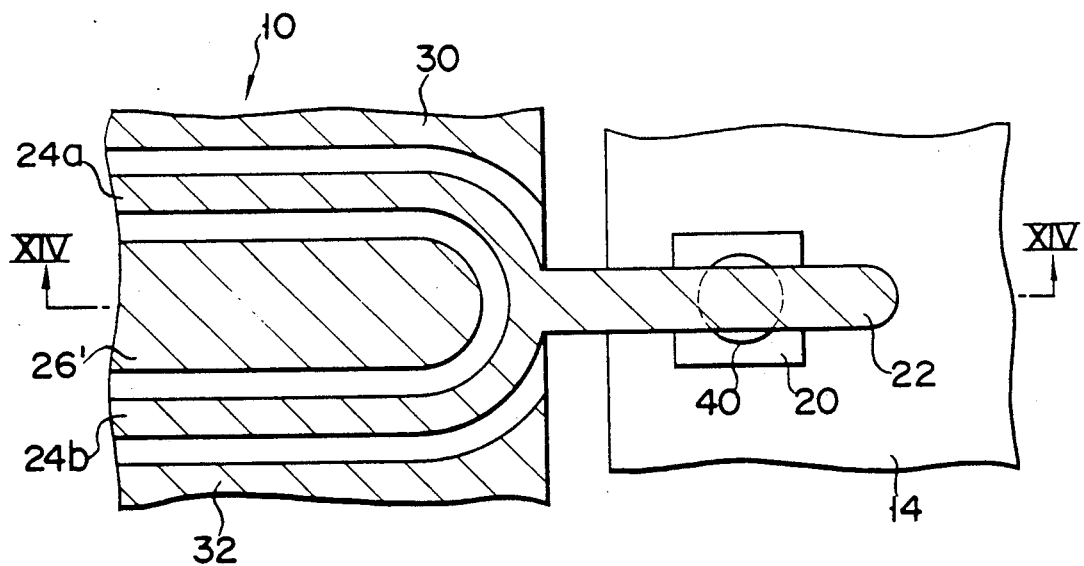
FIG. 13 is a diagram showing a plan view of the main portion of a TAB substrate having a "coplanar transmission line structure"
Figure 14:
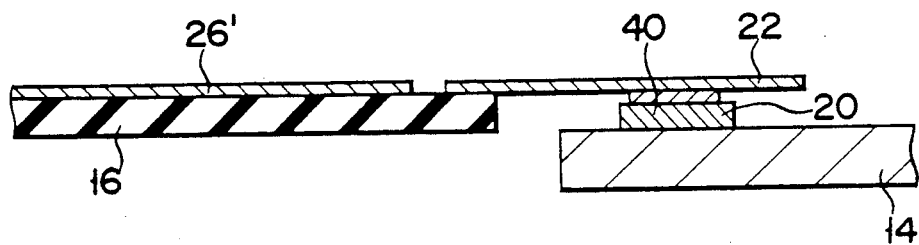
FIG. 14 is a diagram showing a sectional view of the TAB substrate taken along line XIV—XIV in FIG. 13.

For example, the input wiring line portion of TAB substrate 10 may be modified to have only one of the "microstrip transmission line structure" and "coplanar transmission line structure". FIGS. 13 and 14 show a modification in which the TAB input wiring line portion has the "coplanar transmission line structure", whereas FIGS. 15 and 16 show a modification in which the TAB input wiring line portion has the "microstrip transmission line structure".

According to TAB substrate 10 shown in FIGS. 13 and 14, ground wiring line 26' formed on TAB substrate film 16 inside branch half pattern 24 of each TAB inner lead 22 does not have a half loop pattern. As is clearly illustrated in FIG. 13, wiring line 26' is formed of a solid conductive thin film located inside branch half loop pattern 24 at a predetermined distance therefrom. No conductive film layer 34 is formed on the rear surface of TAB substrate film 16.

Figure 15:
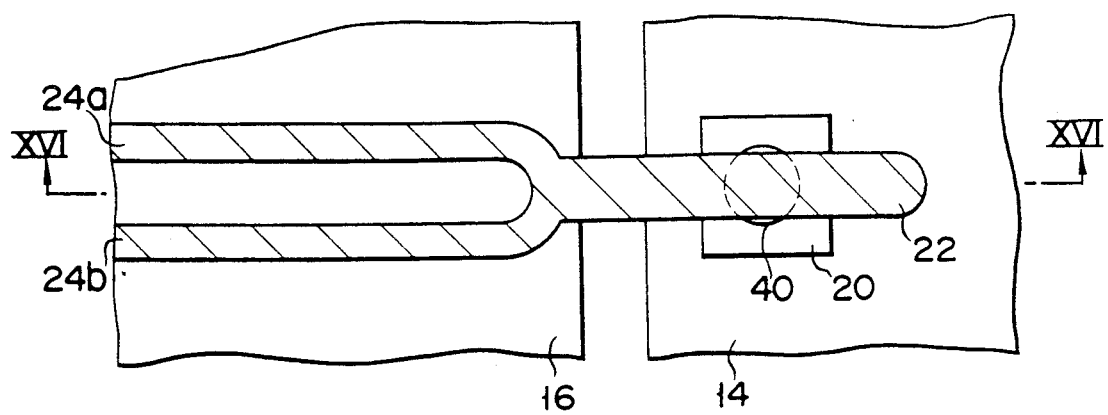
FIG. 15 is a diagram showing a plan view of the main portion of a TAB substrate having a "microstrip transmission line structure"
Figure 16:
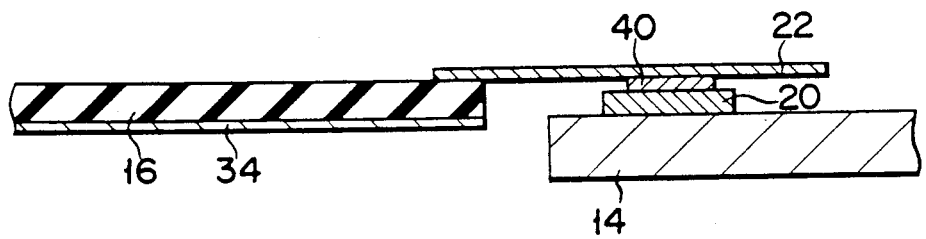
FIG. 16 is a diagram showing a sectional view of the TAB substrate taken along line XVI—XVI in FIG. 15.

According to TAB substrate 10 shown in FIGS. 15 and 16, no ground line is formed between wiring lines 24a and 24b branching from each inner lead 22. Instead of this, ground conductive layer 34 is formed on the entire portion of the rear surface of TAB substrate 10 in the same manner as described in the embodiment of FIG. 1, thereby constituting the "microstrip signal transmission line structure".

Figure 17:
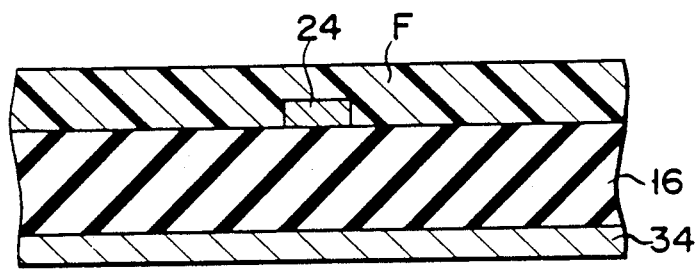
FIGS. 17 to 22 are diagrams showing the sectional structures of the main portions of various modifications of TAB substrate 10 according to the above embodiment of this invention.
Figure 18:
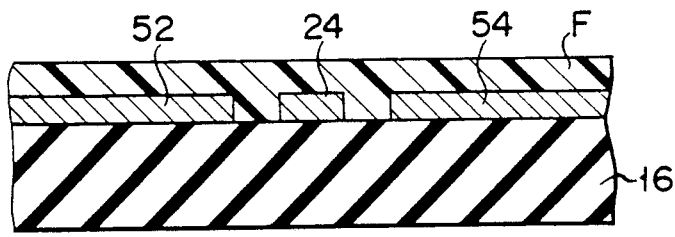
Figure 19:
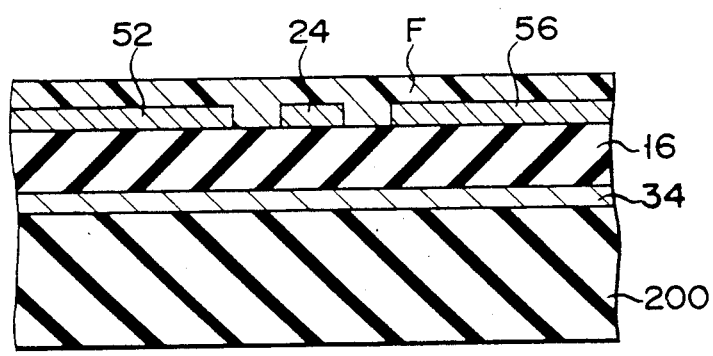
Figure 20:
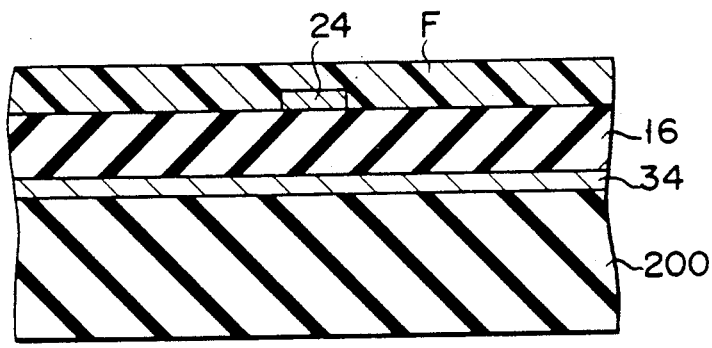
Figure 21:
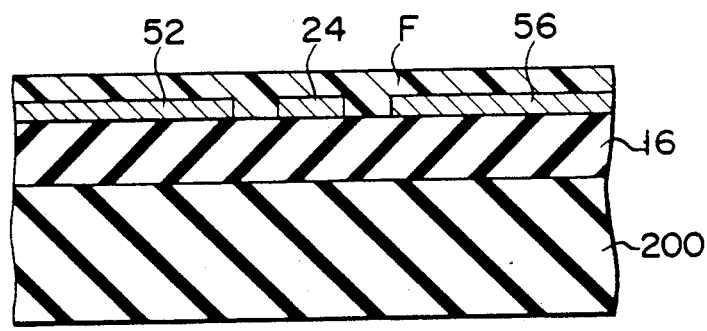

The main sectional view of the TAB substrate with the microstrip transmission line structure is shown in FIG. 17. Insulative resin layer F is deposited to cover signal wiring lines 24 on substrate 16 and layers 52 and 54 disposed on both sides thereof. The main sectional view of the TAB substrate with the coplanar transmission line structure is shown in FIG. 18. Insulative resin layer F is deposited to cover signal wiring lines 24 on substrate 16. FIG. 19 shows TAB substrate 10 with the grounded coplanar transmission line structure stacked on ceramic substrate 200. FIG. 20 shows a TAB substrate with the microstrip transmission line structure stacked on ceramic substrate 200. FIG. 21 shows a TAB substrate with the coplanar transmission line structure stacked on ceramic substrate 200.

Figure 22:
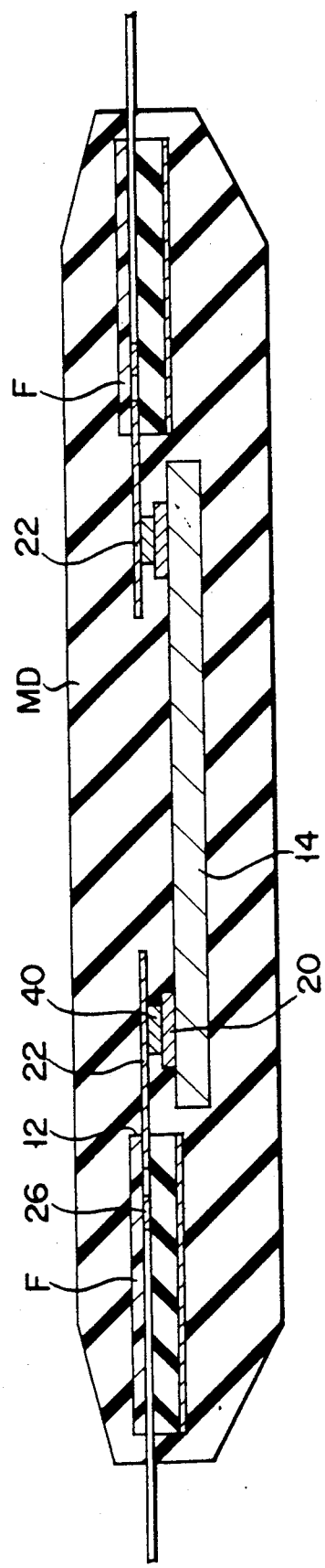

As shown in FIG. 22, a connecting portion (including square opening 12) between TAB substrate 10 of this invention and IC chip 14 can be packaged in its entirety with resin sealing material MD by resin molding, potting (natural dropping of resin) or the like. Since insulative resin layer F is coated on TAB substrate 10 for adjusting characteristic impedance Z before the packaging process using resin sealing material MD, the characteristic impedance of TAB substrate 10 can be appropriately adjusted before the sealing process using resin sealing material MD. It is preferable to use, as resin sealing material MD, insulative material having a dielectric constant smaller than that of insulative resin layer F. For example, when a solder resist film is used as insulative resin layer F as described before, silica epoxy resin may preferably be used as resin sealing material MD. The dielectric constant of silica epoxy resin is 4.3. Further, it is preferable to set the thickness of resin sealing material MD to a thickness value corresponding to the saturation region of the characteristic impedance or the neighboring region thereof. With such an arrangement, unwanted variation in the characteristic impedance of TAB substrate 10 due to the sealing with resin sealing material MD can be prevented.

What is claimed is:

1. A tape-automated bonding substrate for a semiconductor IC chip having signal terminals, said substrate comprising:
    (a) an insulative layer base film having a peripheral end;
    (b) a conductive thin-film layer formed on said base film to define a wiring line pattern, said pattern comprising,
    feedthrough type signal transmission wiring lines connected to said signal terminals of said IC chip, each of which includes a contact portion to which a corresponding one of said signal terminals of said IC chip is directly connected, first terminal pads receiving external high-speed signals and second terminal pads to which external impedance matching and adjusting resistors are connected, said first and second terminal pads being arranged along said peripheral end of said substrate; and
    (c) insulative layer means deposited on said substrate to at least partly cover said feedthrough type signal transmission wiring lines, said insulative layer means having a selected thickness to change the impedance of said feedthrough type signal transmission wiring lines to a desired target value.

2. The substrate according to claim 1, wherein each of said feedthrough type signal transmission wiring lines is bent at said contact portion and branched into two sub-wiring lines substantially radially extending from an opening in which said IC chip is disposed on said base film.

3. The substrate according to claim 2, wherein said contact portion of each of said feedthrough type signal transmission wiring lines comprises an interconnection lead which projects from said opening.

4. The substrate according to claim 3, wherein said feedthrough type signal transmission wiring lines have a microstrip transmission line structure.

5. The substrate according to claim 3, wherein said feedthrough type signal transmission wiring lines have a coplanar transmission line structure.

6. The substrate according to claim 3, wherein said feedthrough type signal transmission wiring lines have a combined line structure of a microstrip transmission line structure and a coplanar line structure.

7. An assembly for an electric circuit device having signal transmission terminals, said assembly comprising:
   an insulative substrate;
   a conductive lead wiring line formed on said substrate and electrically connected to one of the signal transmission terminals of said device, said wiring line having an impedance;
   impedance adjustment means provided on said substrate for controlling the impedance of said lead wiring line so that it is adjusted at a desired target value;
   said impedance adjustment means comprising an insulating layer which is formed on said substrate to cover at least part of said lead wiring line; and
   said insulating layer having a selected thickness which enables the impedance of said lead wiring line to be converted to a target impedance value.

8. A circuit substrate comprising:
   a flexible insulation film;
   a conductive wiring line formed on said substrate as a signal transmission line, said wiring line having a first end adapted to be connected to a terminal of a semiconductor device and a second end for receiving a signal externally supplied thereto;
   a conductive layer formed on said substrate and connected to a ground potential; and
   an insulative layer formed on said substrate to at least partially cover said wiring line, said insulative layer having a certain thickness which is specifically selected to adjust an impedance value of said wiring line to have a predetermined target impedance value.

9. The substrate according to claim 8, wherein said conductive layer comprises:
   first and second ground wiring layers formed on one surface of said substrate together with said wiring line so that the first and second ground wiring layers are positioned at both sides of said wiring line.

10. The substrate according to claim 9, wherein said insulative layer covers at least partially said wiring line and said ground wiring layers.

11. The substrate according to claim 8, wherein said conductive layer comprises a ground layer, and wherein said wiring line and said insulative layer are formed on a surface of said substrate whereas said ground layer is formed on an opposite surface of said substrate.

12. The substrate according to claim 11, wherein said insulative layer comprises a multi-layered insulation thinfilm layers.

13. The assembly according to claim 21, wherein said insulative layer has a plurality of laminated insulation layers.

14. The assembly according to claim 21, wherein said lead wiring line comprises:
   a contact lead portion connected to a corresponding one of said signal transmission terminals of said electric circuit device; and
   first and second sub-lead wiring line portions branched from said contact lead portion, thus constituting a feedthrough type signal transmission line.

15. The assembly according to claim 14, wherein said insulative layer partly covers said first and second sub-lead wiring portions and said contact lead portion.

16. The assembly according to claim 14, wherein said insulative layer covers the entire portion of said first and second sub-lead wiring portions and said contact lead portion.

* * * * *